Dec. 22, 1970 JAMES E. WEBB 3,549,435
ADMINISTRATOR OF THE NATIONAL AERONAUTICS
AND SPACE ADMINISTRATION
METHOD OF MAKING SEMICONDUCTOR P-N JUNCTION STRESS
AND STRAIN SENSOR
Original Filed Sept. 6, 1966

INVENTORS
JIMMIE J. WORTMAN
RALPH R. STOCKMAN

BY

William H. King
ATTORNEYS 3,549,435

METHOD OF MAKING SEMICONDUCTOR P-N JUNCTION STRESS AND STRAIN SENSOR

James E. Webb, Administrator of the National Aeronautics and Space Administration, with respect to an invention of Jimmie J. Wortman, Durham, and Ralph R. Stockard, Raleigh, N.C.

Original application Sept. 6, 1966, Ser. No. 577,548, now Patent No. 3,432,760. Divided and this application Aug. 1, 1968, Ser. No. 763,040
Int. Cl. H01f 7/44
U.S. Cl. 148—187 3 Claims

ABSTRACT OF THE DISCLOSURE

Method for making a rod of one type semiconductor material with a needle-like point at one of its ends and another type semiconductor material diffused into the surface of the rod at said one of its ends to form a P-N junction at said needle-like point. The rod with the P-N junction formed on its end is useful as a stress and strain sensor.

This application is a division of application Ser. No. 577,548 filed Sept. 6, 1966 and now Pat. No. 3,432,760.

The invention described herein was made in the performance of work under a NASA contract and is subject to the provisions of Section 305 of the National Aeronautics and Space Act of 1958, Public Law 85–568 (72 Stat. 435; 42 U.S.C. 4257).

The invention relates generally to a semiconductor p-n junction and more specifically concerns a semiconductor p-n junction on the apex of a needle making it suitable for sensing stresses and strains.

It has been known for some time that the electrical characteristics of p-n junctions in semiconductors are altered when a junction or junctions are subjected to large hydrostatic or anisotropic stresses. Stress levels on the order of $10^{10}$ dynes/cm.$^2$ are required to obtain useful changes in the electrical properties of the p-n junctions. In order to obtain the large stresses it has been common practice to use an indentor point with a very small radius of curvature such as a steel or diamond phonograph needle. Using this method, the needle point is placed on or near the desired junction in the semiconductor and a force is applied to the needle to create the desired stress in the junction. Even under ideal laboratory conditions, the alinement of the indentor point and the small junction area is a very tedious task which must be performed under a microscope. The cross-sectional area stressed is necessarily small because the stress levels required to produce the piezo junction effect are high. Any lateral movement of the indentor point after it has been placed on the junction removes it from the junction and in some cases causes permanent damage to the device. The problem of alining the indentor point and keeping it aligned is even more acute in practical applications of the piezo junction effect.

The p-n junction stress and strain sensor that constitutes this invention eliminates the critical alinement problem prevalent in the indentor point method of stress application, yet inherently allows smaller areas to be stressed than does the indentor point method and therefore can be made more sensitive. The invention is a semiconductor in the form of a needle with a p-n junction or junctions on its apex. Stress is applied by forcing the apex of the needle which is the p-n junction onto a smooth conductive surface. No critical alinement is necessary. Electrical contact is made on one side of the junction by contacting the conductive surface, and on the other side of the p-n junction by any of the existing methods of securing ohmic contact to semiconductors such as bonding to a conducting wire or alloying the needle to a metal tab.

An object of the invention is to eliminate the problem of alining an indentor point to apply stresses to p-n junctions in semiconductors to change the electrical properties of the p-n junctions.

Another object of the invention is to provide a p-n junction on the apex of a needle.

A further object of this invention is to provide a method for producing a p-n junction on the apex of a needle.

Other objects and advantages of this invention will further become apparent hereinafter and in the drawings, in which.

Figure 1:
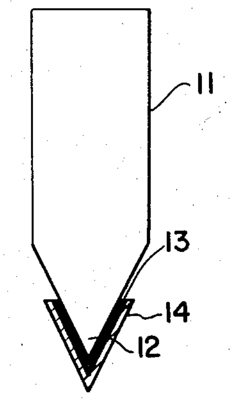
FIG. 1 is an embodiment of the invention produced by a first method.

Turning now to the embodiment of the invention shown in FIG. 1, the number 11 designates a needle made from a semiconducting material. For the convenience of describing the invention, it will be assumed that needle 11 is made from n-type silicon. However, the invention and methods for producing the invention are equally applicable to n-type or p-type silicon or germanium or any other semiconductor such as the III–V compounds. At the apex 12 of needle 11 a layer 13 of p-type silicon is diffused into the surface of the needle and layer 13 is plated over with a layer 14 of nickel.

Figure 2:
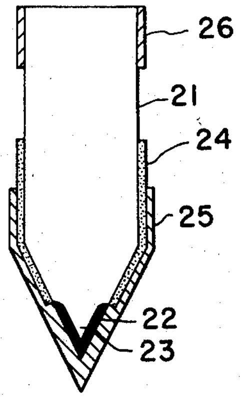
FIG. 2 is another embodiment of the invention produced by a second method.

The embodiment of the invention shown in FIG. 2 consists of a needle 21 of n-type silicon identical to needle 11 in FIG. 1. A layer 22 of p-type silicon is diffused into the surface of needle 21 at its apex 23. A layer 24 of silicon dioxide is formed around needle 21 and layers 22 and 24 are coated with a layer 25 of aluminum. The blunt end of needle 21 is coated with a layer 26 of nickel to provide a metallic electrical contact.

Either the embodiment of the invention shown in FIG. 1 or the embodiment shown in FIG. 2 can be used to measure a force by placing the apex of the needle against a smooth conductive surface and applying the force to the needle against the surface. This force changes the electrical characteristics of the p-n junction which change is proportional to the force and can be measured by suitable electric circuit means. These embodiments of the invention can be used to fabricate a host of transducers such as, force sensors, stress sensors, strain sensors, pressure sensors, accelerometers, and displacement sensors.

The method for making the needles 11 and 21 will now be described and then the methods for making the embodiments of the invention in FIGS. 1 and 2 will be described.

A diamond saw is used to slice the n-type silicon material into rectangular bars approximately one-half inch long and 20 mils on each side. These bars are then silver soldered onto the ends of brass rods which have been previously drilled for this purpose so as to provide mechanical support and electrical contact for the following electro-etching operation.

A plastic vat with a valve near the bottom is used to hold and control a nitric acid-hydrofluoric acid etching solution. A platium wire is wound around the inner periphery of the vat for use as an electrode for the process. The etching solution is allowed to slowly drain out through the valve and thereby lowers the liquid level in the vat at a controlled rate.

A mechanical manipulator is used to raise and lower the brass rod silicon bar assembly, and is initially set so that the tip of the silicon bar is approximately ⅛ inch below the surface of the etching solution. The solution surface is simultaneously allowed to recede at a rate of approximately ⅛ inch per minute. A high intensity light source is used to provide hole-electron pairs at the silicon-solution interface to aid in the electro-etching process. An A.C. potential of approximately 30 volts is applied using the brass rod silicon bar assembly as one electrode and the platinum wire as the other. This allows a current of approximately 20 ma. to flow through the system.

Silicon needles fabricated by this method are highly polished and possess tip diameters on the order of 1 to 50 microns. The radius of curvature of the tip depends on the initial size of the silicon bar, the initial depth of the bar beneath the etching solution, the solution surface descent rate, the solution concentration and mixture ratio, the current density through the system, the intensity of the light source and the temperature of the solution.

The method for making the embodiment of the invention shown in FIG. 1 will now be described. Following the etching operation, the needle is cleaned and placed in an ordinary diffusion furnace where a p-type dopant is diffused into the needle surface to a desired depth thereby forming a p-n junction between the diffused layer and the bulk material. Following the diffusion operation, the needle is plated over its entire surface area with an electroless nickel.

In order to reduce the p-n junction area and to get electrical contact to the bulk material, the diffused layer is etched away everywhere except the apex of the needle. This is done by lowering the needle point into a molten wax solution to the desired depth and following by an etch to remove the diffused layer. The etch does not attack the wax. After the diffused layer is removed, the wax is removed leaving the finished needle.

Needles sensors made by the above method are sensitive to applied stress. However, they have two major disadvantages. First, they are susceptable to a mechanical failure at the junction-bulk material interface. Second, this same interface is not protected, leaving the junction open to contamination from the atmosphere. This allows the electrical characteristics to drift with time.

The method for fabricating the needle sensor in FIG. 2 is a much more suitable method. In this second method the needle is first placed into an oxidation furnace where an oxide is formed over the entire surface. The needle is then coated with a photo-sensitive acid resist and allowed to dry. This acid resist has the property of remaining intact after development wherever it has been exposed to light. Next, the apex of the needle is lowered into molten black wax to a depth of a few mils using a mechanical manipulator. The photoresist is then exposed using an intense light source. It is desirable that only a small portion of the tip be submerged into the wax as this later determines the junction area. The photoresist is then developed in TCE which removes the wax and unexposed resist leaving a protective coating over all except the very apex of the needle. The needle is then submerged into a dilute HF solution which removes the oxide from the unprotected apex exposing the bulk material. Following the HF etch, the photoresist is removed by standard means.

The next step is a plate the needle into an ordinary gas diffusion furnace where a p-type dopant is diffused into the unprotected apex. The oxide on the remainder of the needle prevents it from being diffused. An effort is made to form a junction which is shallow in depth and high in surface concentration as this combination is more sensitive to stress. A layer of aluminum is then evaporated over the entire needle. Next, the apex of the needle is coated with wax for protection, and the aluminum chemically etched away from all except the wax protected portion of the needle. This process leaves a metallic contact on the diffused or p-region of the junction.

The apex of the needle is once again protected by wax, making sure that the wax extends past the aluminum contact. The unprotected part of the needle is then etched which removed the oxide. The needle is then placed into an electroless nickel solution which deposits a metallic electrical contact on the bulk or n-region of the diode. With this step, the needle sensor is completed.

The needle sensor shown in FIG. 2 is more mechanically rigid and electrically stable than the sensor shown in FIG. 1. This is due to the fact that no notch is etched into the FIG. 2 needle at the junction interface and the junction is inherently passivated by the oxide.

The advantages of the needle sensor described herein eliminates the critical alinement prevalent in the indentor point method of stress application. It inherently allows smaller areas to be stressed than does other existing methods and therefore can be made more sensitive.

The methods described above for fabricating needle sensors are given as typical methods and are not the only methods. The above methods are similar to methods used in the semiconductor industry to fabricate mesa and planer devices. P-n junction or junctions can be formed on the apex of the semiconductor needle by any of the other techniques commonly used in industry without departing from the spirit or scope of this invention. Although this invention describes only a two-layer diode in the form of a needle, it is apparent that a four-layer diode in the form of a needle could be fabricated without departing from the spirit or scope of this invention. Such a device would possess the simplicity and sensitivity of a single junction sensor and the force to frequency conversion capabilities of a four-layer diode.

What is claimed is:

1. A method for making a p-n junction stress sensor on the apex of a needle comprising the steps of: making a needle from one type of semiconductor material; diffusing a dopant material into the apex of said needle to change the material type; and plating the apex of said needle over said diffused material with a metal.

2. A method for making a p-n junction stress sensor on the apex of a needle as claimed in claim 1 wherein said step of making a needle from one type of semiconductor material comprises the steps of: providing a bar of said semiconductor material; suspending one end of said bar into an etching solution; applying an electric potential between the semiconductor bar and the etching solution; and raising and lowering said etching solution so as to cause said bar to be etched away to a point at said one end.

3. A method for making a p-n junction stress sensor on the apex of a needle as claimed in claim 1 wherein said step of diffusing another type of semiconductor material into the apex of said needle comprises the steps of: forming an oxide over the entire surface of said needle; coating the needle with a photosensitive acid resist; coating the apex of the needle with a dark wax; exposing the needle to a light source; developing the photoresist which removes the wax and unexposed resist leaving a protective coating over all except the apex of the needle; removing the oxide from the apex of the needle; and diffusing said another type of semiconductor material into the apex of said needle.

References Cited

UNITED STATES PATENTS

| | | | |
|---|---|---|---|
| 2,705,768 | 4/1955 | Kleimack et al. | 317—235 |
| 3,251,009 | 5/1966 | Hunter | 333—30 |

FOREIGN PATENTS

| | | | |
|---|---|---|---|
| 1,298,131 | 5/1962 | France | 317—235 |

L. DEWAYNE RUTLEDGE, Primary Examiner

G. K. WHITE, Assistant Examiner

U.S. Cl. X.R.

148—186

UNITED STATES PATENT OFFICE
CERTIFICATE OF CORRECTION

Patent No. 3,549,435 Dated December 22, 1970

Inventor(s) James E. Webb, Administrator of the National Aeron tics and Space Administration, with respect to an vention of Jimmie J. Wortman et al.

It is certified that error appears in the above-identified patent and that said Letters Patent are hereby corrected as shown below:

In the heading to the printed specification, line 9, and Column 1, line 25, "3,432,760", each occurrence, should read -- 3,432,730 --.

Signed and sealed this 7th day of December 1971.

(SEAL)
Attest:

EDWARD M.FLETCHER,JR.
Attesting Officer

ROBERT GOTTSCHALK
Acting Commissioner of Pat